United States Patent [19]

Scardina et al.

[11] 4,251,804

[45] Feb. 17, 1981

[54] DELTA MODULATION UTILIZING SELECTABLE PIECEWISE LINEAR WAVEFORM APPROXIMATION

[76] Inventors: Mark V. Scardina, 2383 - 39th Ave., San Francisco, Calif. 94116; David A. Bergen, 2101 Shelter Bay Ave., Mill Valley, Calif. 94941

[21] Appl. No.: 943,420

[22] Filed: Sep. 18, 1978

[51] Int. Cl.³ ............................................. H03K 13/02
[52] U.S. Cl. .............................. 340/347 R; 332/11 D; 340/347 M; 340/347 NT; 340/347 AD; 340/347 DA; 375/27
[58] Field of Search .... 340/347 M, 347 AD, 347 NT; 325/38 B; 332/11 D; 179/15 AV; 375/27

[56] References Cited

U.S. PATENT DOCUMENTS

| | | | |
|---|---|---|---|
| 3,979,676 | 9/1976 | Poma | 325/38 B |
| 4,101,881 | 7/1978 | De Freitas | 325/38 B X |
| 4,107,610 | 8/1978 | Weber | 325/38 B X |
| 4,129,863 | 12/1978 | Gray et al. | 340/347 AD |

OTHER PUBLICATIONS

The Engineering Staff of Analog Devices, Inc., Analog-Digital Conversion Handbook, 1972, pp. III-4 to 7.
The Engineering Staff of Analog Devices, Inc., Analog-Digital Conversion Handbook, 6/1972, pp. I-64, 65.

*Primary Examiner*—Thomas J. Sloyan
*Attorney, Agent, or Firm*—Townsend and Townsend

[57] ABSTRACT

An analog-to-digital and digital-to-analog conversion system utilizes a modified delta modulation technique, together with generation of a number of linear waveforms forming a piecewise linear approximation of an analog signal to be encoded and decoded, to digitize the analog signal as a pulse train and subsequently retrieve an approximation of the original analog signal from the pulse train. The system comprises encoder and decoder sections of near identical structure. The encoder section includes compare circuits that compare the signal to be encoded to a reference signal and generate therefrom a binary indication of such comparisons. Successive ones of the binary indications form the digital pulse train containing information later used to approximate the analog signal being digitized. A predetermined number of such binary indications immediately preceding the present comparison are temporarily stored and used to generate one of a plurality of linear waveforms, successive ones of which form the reference signal. The decoder section is identical to the encoder section-except that it lacks the compare circuitry. The digital pulse train generated by the encoder is applied to the decoder and used to successively generate selected ones of the plurality of linear waveforms which are used to form the linear piecewise approximation of the original analog signal.

7 Claims, 2 Drawing Figures

FIG.—1.

DELTA MODULATION UTILIZING SELECTABLE PIECEWISE LINEAR WAVEFORM APPROXIMATION

This invention relates to an analog-to-digital and digital-to-analog conversion system and, in particular, to a system for communicating or storing an analog signal by digitally describing the difference between successive samples of the signal, a process known as delta modulation, using selective, linear slope generation.

BACKGROUND OF THE INVENTION

In the recent past our society has seen an increasing and continuing computerization of many different types of information. Witness, for example, the amazing increase in digitizing analog signals of various types for storage, transmission and processing purposes. This trend is seen in all fields of electronics, particularly communication, process control and data processing. One particularly successful method of digitally describing analog signals has been what is termed in the art as pulse code modulation (PCM). This method involves sampling the analog signal at regular intervals and coding the signal amplitude in a digital format. A variation of this method includes comparing successive samples of the digital amplitude and storing or transmitting only the differences. This latter method is termed differential PCM.

A very special form of differential PCM involves digitally encoding analog signals by a process known as delta modulation. Analog-to-digital conversion using delta modulation techniques involves periodical comparisons of the analog signal to a reference signal. The instantaneous polarity of the difference between these two signals is sampled at intervals controlled by a clock to produce a logic ONE or ZERO. The sample is temporarily stored in a storage device (typically a flip-flop) where it is held until updated by a subsequent sample. The output of the storage device, which is also the output of the delta modulator, is applied to an integrating network which, through step-like increments, constructs the analog signal to form the reference signal that is compared to the original.

At the receiving or decoding end of the system, the digitized signal is received and applied to a similar integrating network to reconstruct and retrieve the analog signal in a representation that is as accurate a representation of the original as possible.

The particular conversion method chosen for digitizing (and subsequent recovery of) any particular analog signal requires several trade-offs. For example, if the particular analog signal to be digitized has a relatively wide dynamic range (e.g., the signal contains large amplitude variations) one can choose a PCM technique. However, PCM techniques utilize very high bit rates which, in turn, produce such disadvantages as the requirement of a much larger storage space to store digitized information. Moreover, PCM techniques operate using word configurations; that is, the information is in the form of successive, multi-bit data words. Accordingly, if some bits of information, the more significant or heavily weighted bits, are lost during transmission a significant amount of information can be lost. Finally, retrieval of an analog signal encoded using PCM techniques typically requires sophisticated filtering—adding to the expense and complexity of the method. Furthermore, many PCM systems are complex, expensive, and difficult to maintain.

On the other hand, one may choose to digitize the analog signal using a form of delta modulation and obtain the advantage attendant therewith of low bit rates. However, because of the restricted dynamic range per step of typical delta modulation systems, the difference between two adjacent sample values will be incorrect if the signal variation is large. The delta modulator system cannot, therefore, follow this change and the error is referred to as "slope overload". Thus, the fidelity of the signal reconstructed at the decoding or receiving end will not be quite what is desired.

One attempt to solve this particular problem has been to increase the quantizing steps of the delta modulator system by increasing the bit rate. Unfortunately, this solution is possible only at the expense of increased quantization noise (granular noise) that is introduced when the digitally encoded signal is converted back to analog form at the receiving or decoding end of the system. This distortion is experienced when the input analog signal has a negligible input change relative to the step size of the binary signal transmitted by the delta modulator. In trying to reproduce the input analog signal the receiver, therefore, introduces an overriding square wave or triangular wave pattern, depending upon whether or not it is a wide pulse or a narrow pulse system, because the step size is too large.

Other attempts to achieve as universal a conversion system as possible have included, for example, the use of a more specialized differential pulse code modulation method with more than one step size. This type of system is generally referred to as multilevel quantization. However, in addition to being more complex and expensive than simple delta modulators, such multilevel quantization systems are considerably more difficult to maintain and adjust.

Accordingly, there is a need to provide a low-cost, simple system that can digitize, transmit or store, and retrieve an analog signal of relatively wide dynamic range utilizing relatively low sample rates at relatively low bit rates.

SUMMARY OF THE INVENTION

The present invention, therefore, provides a system for digitizing, transmitting or storing, and subsequently retrieving an analog signal using a form of delta modulation, thereby obtaining the advantages thereof. The present invention also provides a simple and inexpensive system that utilizes a relatively low bit rate to achieve maximum signal fidelity together with the capability of handling analog signals with relative wide dynamic ranges.

According to the present invention, therefore, there is provided a system comprising an encoding section for converting an analog signal to a digital format using delta modulation techniques and a decoding section for retrieving a high-fidelity representation of the original analog signal from its digitized form. The encoding section includes a comparator for comparing the analog signal to a reference signal. The output of the comparator is one of two voltage levels, each indicating a particular difference between the two signals at any moment in time. A storage element periodically samples the output of the comparator and stores a predetermined number of successive samples. The output of the storage element, which is also the output of the encoder section, is a pulse train that describes the time-related changes of the analog signal relative to the reference signal. The contents of the storage element represent the "past history" of the analog signal relative to the reference signal. Accordingly, the contents of the storage element are applied to a reference signal generator and used to selectively generate one of a number of predetermined linear ramps or linear waveforms which are successively combined to form the reference signal.

The decoding section of the system includes essentially the same circuit elements as the encoding section with the exception of the comparator. The digitized analog signal, in the form of a digital pulse train, is received by a storage element to temporarily store a predetermined number of successive pulses of the train and apply them to a waveform generator. The contents of the storage element are analyzed and used by the waveform generator to select and generate one of a number of linear waveforms which are successively combined to approximate the original analog signal.

In the preferred embodiment, the relative rates of change of the analog input and reference signals are compared. The comparator provides an output that is one of two possible states, indicating that the rate of change of one of the compared signals is greater than the other. The output of the comparator is periodically sampled by a sampling circuit in the form of a flip-flop and temporarily stored. The output of the sampling circuit is a successive stream of such samples which form a digital pulse train. Each sample or "bit" of the pulse train describes the relative rate of change between the analog and reference signals. A predetermined number of the samples that immediately precede (in time) the sample presently held in the sampling circuit are stored in a shift register. As each new sample is obtained by the flip-flop, the previously held sample is stored in the shift register with preceding samples to form, in effect, a digital representation of the "recent history" of the differences between the analog and reference waveforms.

The reference signal generator includes a ramp generator capable of selecting and creating one of a number of linear waveforms of predetermined slopes. In particular, the contents of the shift register are applied in parallel to ramp selection logic which, in turn, selects one of a number of voltage levels that are applied to a selected capacitance and used by the ramp generator to create a particular linear waveform. In effect, therefore, the "recent history" of the analog waveform is used to adjust the rate of change of the reference signal by selecting an appropriate linear waveform having a slope more closely following that of the analog input waveform. The output of the reference signal generator is a number of linear ramps which, when accumulated in successive fashion, form a linear piecewise approximation of the analog signal being digitized.

The pulse train output of the encoder section may be communicated directly to the decoder section or stored and subsequently communicated to the decoding section for later retrieval of the analog signal. In any event, when the analog signal is wished to be extracted from the pulse train, it is applied to a system constructed as outlined in connection with the encoding section by coupling the pulse train directly to the input of the flip-flop, shift register and the ramp control logic. The output of the ramp generator becomes the reconstructed analog signal.

A number of advantages should now be evident. Since the system of the present invention utilizes, in essence, delta modulation techniques, the advantage of a relatively low bit rate is obtained. In addition, the capability of generating a reference signal comprising a piecewise succession of linear ramps allows the encoder section to more closely track the analog input signal being digitized. Accordingly, a reduction of quantizing noise during analog-to-digital conversion is obtained. Further, distortion is also reduced during reconstruction of the analog signal at the decoder section without the need of extensive (and often expensive) filtering or integration networks.

A further advantage is obtained when it is realized that the ramp selection converter can be made "programmable". In such a case, this system can be easily modified with a minimum of expense and effort to fit specialized waveforms for digitizing, transmission and subsequent decoding.

These and further advantages will be readily apparent to those skilled in the art after reference is had to the enclosed drawings in conjunction with the following description thereof and the claims of the invention appended hereto.

DETAILED DESCRIPTION OF THE INVENTION

Figure 1:
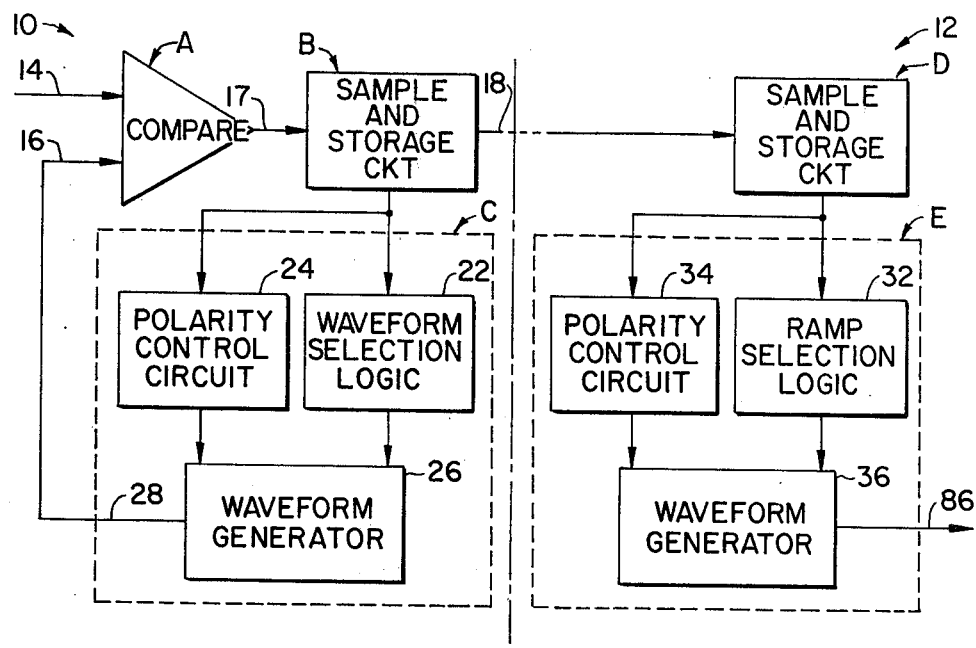
FIG. 1 is a block diagram of one embodiment of the present invention utilizing delta modulation to encode an analog signal.

Referring now to FIG. 1, the system of the present invention is shown as comprising an encoding section 10 for converting an analog signal to digital format and a decoding section 12 for retrieving the analog signal from its digitized form. Encoding section 10 of the invention includes comparator A, sample and storage circuit B, and a reference signal generator C. Output terminal 18 carries the output of the encoder: A digital pulse train. The contents of sample and storage circuit B are applied in parallel to waveform selection logic 22 and polarity control circuit 24 of reference signal generator C. Also included in reference signal generator C is waveform generator 26 to which is coupled selection logic 22 and polarity control circuit 24. Generator 26 is capable of generating one of a number of linear waveforms or ramps, the slope of which is determined by selection logic 22 while the polarity of the waveform is dictated by polarity control circuit 24, as will be more particularly seen below.

Decoder section 12 of the system of the present invention includes that portion described in conjunction with the encoder section used to generate the reference signal. That is, decoder section 12 includes a sample and storage circuit D and signal generator E which, in turn, comprises waveform selection logic 32, polarity control circuit 34 and waveform generator 36. These elements and their function are identical to their counterparts of encoder section 10, as will be more fully described below.

Before continuing with a more detailed description of the system, it may be beneficial at this point to stop and outline briefly the operation of the invention with reference to FIG. 1. Accordingly, an analog signal to be digitized is applied to input terminal 14 of comparator A. A reference signal, generated by reference signal generator C, is applied to input terminal 16 of the comparator. The rates of change of the two signals are compared and, at any particular moment in time, the comparator provide an output of one of two digital states. A first state provided at the output of comparator A would indicate, for example, that the analog signal applied to comparator input 14 has a rate of change (voltage or current per unit of time) greater than that of the reference signal; a second state would indicate the converse. The output provided by comparator A is periodically sampled and a succession of such samples forms a digital pulse train that is the digitized representation of the input analog waveform.

A predetermined number of such samples of the output comparator A, immediately preceding in time the present sample, are stored serially in sample and storage circuit B. The stored contents of sample and storage circuit B is indicative of, therefore, a recent history of how well, or how badly, the reference signal is tracking the input analog signal. For example, if all or a majority of the samples that immediately precede the present sample are of the same digital (logic) state, this would indicate that the reference signal has been failing to completely track the input analog signal. Accordingly, the waveform generator 26 will be commanded by selection logic 22 to generate a linear waveform having a greater rate of change than those previously generated in an effort to match the rate of change of the analog input signal.

Alternately, if the analog signal is and has been constant for a period of time (indicated, for example, by the contents of sample and storage circuit B being a relatively equal number of alternate digital states), a much smaller reference signal rate of change is called for the next sample time.

The direction of the waveform generated by waveform generator 26 is determined by noting the digital state of the present sample of comparator A. If, for example, comparator A indicates that the rate of change of the reference signal is greater than that of the analog input signal, this indication will be applied (via sample and storage circuit B) to polarity control 24. In turn, the next successive linear waveform generated by waveform generator 26 will be provided with a rate of change having a polarity opposite that of the analog input signal.

Figure 2:
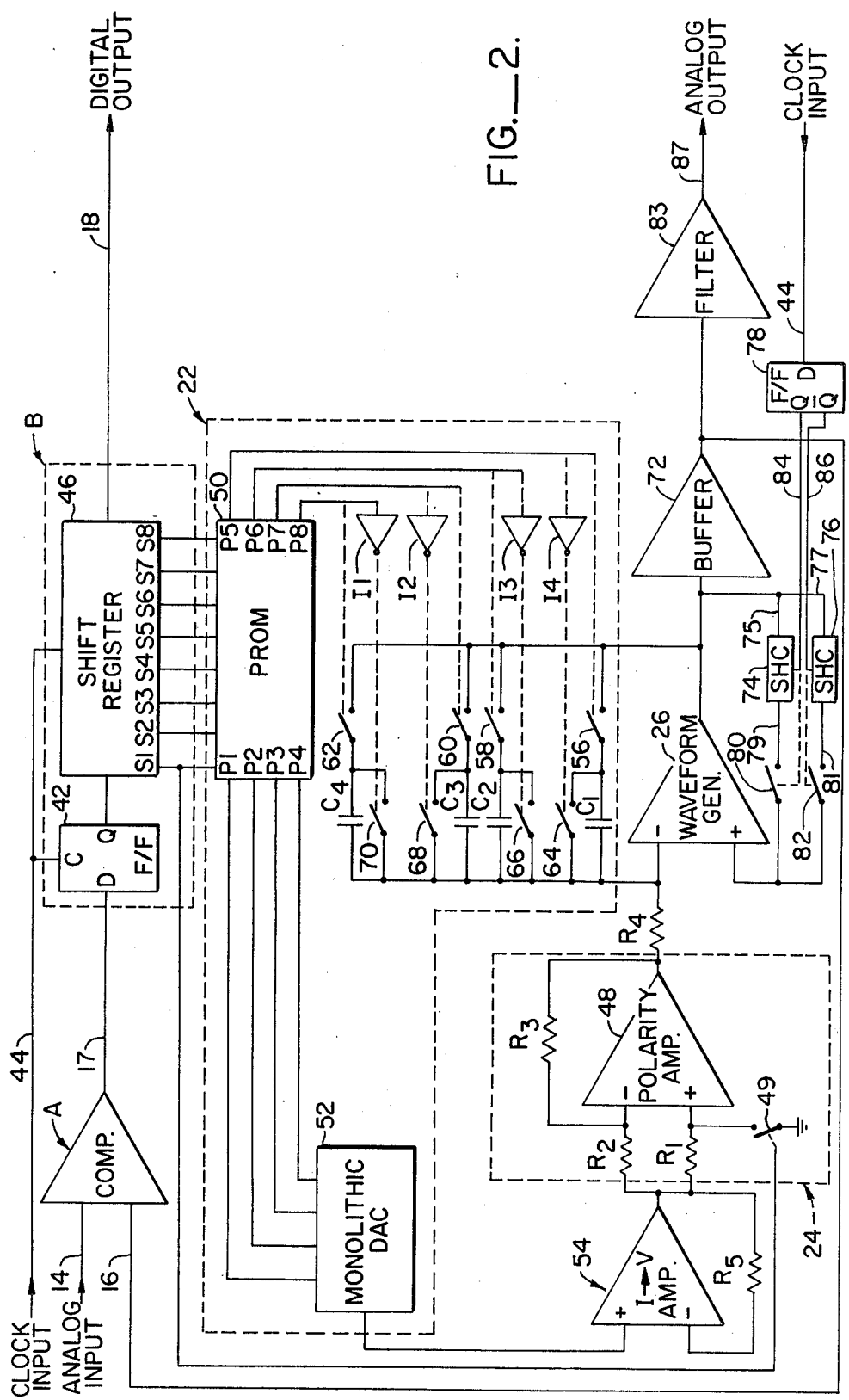
FIG. 2 is a partial block and partial schematic diagram of the encoding portion of the system illustrated in FIG. 1.

Referring now to FIG. 2, there is illustrated in partial block and schematic diagram form the encoder section 10 of the present invention. The comparator A is a rate of change comparator of known configuration such as, for example, that shown and described at pages 111–112 of "Applications of Operational Amplifiers—Third Generation Technology", published by McGraw-Hill. The design of comparator A is such that only one of two possible digital states or voltage levels will appear on output line 17 of the comparator. For example, if the rate of change of the reference signal applied to comparator input 16 is greater than that of the analog input signal appearing at input 14, a first voltage level will be applied to output line 17. If, however, the reference signal rate of change is less than or equal to the rate of change of the analog signal at input 16, a second voltage level will be applied to output line 17. Thus, the output provided by comparator A will be one of two digital states (i.e., a logic ONE or a logic ZERO) which depends upon the relative rates of change of the signals appearing at inputs 14 and 16.

Output line 17 of comparator A is applied to flip-flop 42, which comprises the sampling circuit of sample and storage circuit B. A clock signal, applied to terminal 44, is coupled to flip-flop 42 so that the binary signal generated by comparator A is periodically sampled at regular intervals and temporarily stored in the flip-flop.

The Q output terminal of flip-flop 42 is applied to an eight-stage shift register 46. Clock terminal 44 is also coupled to shift register 46 so that as each clock pulse causes flip-flop 42 to sample the present output of comparator A, the immediately preceding sample is clocked into and stored in the shift register—along with the seven successive samples immediately preceding the sample presently being stored in the shift register.

The output S1 of shift register 46 is applied to the polarity control circuit 24 which includes amplifier 48 having input resistors R1 and R2, feedback resistor R3 and output resistor R4. Resistors R1, R2 and R3 are selected so that amplifier 48 will have unity gain, whether or not resistor R1 is placed at ground potential by analog switch 49. Shift register output S1 is electrically coupled to analog switch 49 to selectively ground the non-inverting input of amplifier 48. For example, if a low voltage (e.g., a logic ZERO), appears on output S1 of shift register 46, switch 49 will communicate the non-inverting input of amplifier to ground. A high voltage (e.g., a logic ONE) will interrupt this communication.

The contents of shift register 46 are monitored by ramp selection logic 22. Accordingly, the outputs S1-S8 of the eight stages (not shown) of shift register 46 are coupled to programmable read-only memory (PROM) 50 and, in particular, the input of addressing section (not shown) of the PROM. An example of a suitable commercially available PROM is designated as D3624 and is manufactured by the Intel Corporation. Typically, PROM 50 is arranged to contain 256, eight (8) bit data words.

The specific contents of PROM 50 will be more particularly discussed below. It is beneficial at this point to note that the function of PROM 50 is to examine the contents of shift register 46 and to predict therefrom the expected rate of change of the analog input signal being digitized at the next upcoming sample time. Based upon such prediction, PROM 50 translates the shift register content to a data word that is used to select one of several linear waveforms with a predetermined rate of change that waveform generator 26 is capable of generating. The control components of waveform generator 26 are digital-to-analog (DAC) converter 52 and capacitor matrix C1–C4. The outputs P1–P4 of PROM 50 are coupled to DAC 52 to select one of sixteen d.c. voltage levels available. The selected voltage level is applied to waveform generator 26 via a current to voltage converter 54 and polarity control circuit 24. Similarly, PROM outputs P5–P8 are coupled to and operate analog switches 56, 58, 60 and 62 to select one or more of capacitors C1–C4 for insertion in the circuit of waveform generator 26. At the same time, PROM outputs P5–P8 are applied to inverters I1–I4 which, in turn, operate along switches 64, 66, 68 and 70 to neutralize any charge that may be retained by the capacitor associated with the switch when such capacitor is removed from the circuit of waveform generator 26.

Analog switches 49 and 62-70 are commercially available and manufactured by Harris Semiconductor Company under the designation H11-0201-5. Operation of any of the analog switches is such that if a low voltage or logic ZERO appears at one of PROM 50 outputs P5–P8, the particular analog switch 56-62 associated with that particular output of PROM 50 will close (the individual switches are illustrated in an open position). Such switch places the capacitor associated therewith in feedback circuit connection with waveform generator 26. At the same time, invertors I1–I4 invert a logic ZERO to a logic ONE to cause the shorting switch associated therewith to open. Thus, for example, a logic ZERO appearing on PROM output P5 will cause analog switch 56, associated with capacitor C1, to close and, at the same time, open analog switch 64. When capacitor C1 is removed from parallel connection with waveform generator 26 by a logic ONE appearing at PROM output P5, analog switch 56 will open and analog switch 64 will close, the latter for discharging capacitor C1.

As can be seen, the particular voltage level and capacitance selected by PROM 50 specifies the specific rate of change of the waveform generated by waveform generator 26. The direction or polarity of the waveform generated is dictated by polarity control circuit 24.

Waveform generator 26 will provide a waveform, each portion of which exhibits a linear variation of voltage with respect to time. As explained, the particular voltage variation or rate of change of the waveform generated is a function of the particular d.c. voltage level-capacitor combination selected. Successive ones of the linear waveforms generated from a piecewise linear approximation of the analog signal being digitized and is the reference waveform that is applied to input terminal 16 via buffer amplifier 72. The waveform so generated is the accumulation of a number of successive linear waveforms. The continuity of the waveform, that is the accumulation of successive linear ramps to form the desired approximation of the analog input waveform, is accomplished and maintained by sample-and-hold circuits 74 and 76. Such sample-and-hold circuits are well known in the art and the particular circuit presently contemplated is adequately described at page 371 of "A User's Handbook of D/A and A/D Converters", published by John Wiley & Sons, Inc.

Each sample-and-hold circuit 74 and 76 is alternately selected for use by flip-flop 78 to which is applied clock terminal 44. Flip-flop 78 also alternately opens and closes analog switches 80 and 82 which selectively communicate sample-and-hold circuit outputs 79 and 81 to the non-inverting input of waveform generator 26. Input lines 75 and 77 of each sample-and-hold circuit are electrically coupled to output 27 of waveform generator 26.

Operation of the sample-and-hold circuits are as follows: Assume flip-flop 78 has been placed in a state that causes a logic ONE to appear on its outpt line 84; conversely, a logic ZERO will appear on output line 86 of the flip-flop. This condition places sample-and-hold circuit 74 in its "sample" state to sample and track the voltage provided by waveform generator 26. At the same time, analog switch 80 is caused to be opened. Alternately, analog switch 82 is caused to be closed by the logic ZERO appearing on output line 86 of flip-flop 78; sample-and-hold circuit 76 is placed in its "hold" state, holding whatever voltage output was provided by waveform generator 26 at the time the hold command was received. When the next clock pulse is received by flip-flop 78 via clock terminal 44, the states and effective positions of sample-and-hold circuits 74 and 76 reverse. Further, as should now be apparent, this use of alternate sample-and-hold circuits in combination with waveform generator 26 allows each linear waveform generated to start at the voltage level at which the immediately preceding waveform ended. In this manner waveform generator 26 provides a waveform that is formed from a piecewise accumulation of successive selected linear waveforms approximating the analog input applied to input terminal 14 of comparator A.

As explained above, the circuitry of decoder 12, as well as the function of that circuitry, is identical to a portion of encoder 10. In fact, for encoder 10 to function as a decoder, one merely need disconnect comparator A from flip-flop 42 and use terminal 17 as the input of the decoder 12 for receipt of the digitized signal, accompanied by an appropriate clock pulse applied to clock terminal 44. The output of waveform generator 26 is passed through the buffer amplifier 72 and a filter network 83 to appear at output terminal 87 as the reconstructed approximation of the digitized analog signal applied to terminal 17.

It is advantageous at this point to pause and consider the programming of PROM 50. As has been noted, shift register 46 contains the results of the eight prior successive samples of the output of comparator A by flip-flop 42. PROM 50 utilizes this information to estimate what the rate of change of the next successive waveform to be generated by waveform generator 26 will be. Thus, PROM 50 uses the contents of shift register 46 to select the appropriate voltage-capacitor combination.

Set forth below, in Table I, are 25 available waveforms selected by the PROM 50 outputs listed in the fifth column. Each available waveform listed is identified by its rate of change in volts per micro-second (column 2) as well as by a waveform number (column 1). This latter identifier is used in the discussion of how the contents of PROM 50 are specified. It is presently contemplated that values for capacitors C1–C4 will be 470 pico-farads, 0.0016, 0.01 and 0.05 micro-farads, respectively.

TABLE I

| WAVEFORM NUMBER | WAVEFORM RATE OF CHANGE (VOLTS/µS) | DAC OUTPUT (VOLTS) | CAPACITOR | P1 | P2 | P3 | P4 | P5 | P6 | P7 | P8 |
|---|---|---|---|---|---|---|---|---|---|---|---|
| 25 | 4.2 | 15 | C1 | 0 | 0 | 0 | 0 | 0 | 1 | 1 | 1 |
| 24 | 3.0 | 10 | C1 | 0 | 1 | 0 | 1 | 0 | 1 | 1 | 1 |
| 23 | 2.1 | 6 | C1 | 1 | 0 | 0 | 1 | 0 | 1 | 1 | 1 |
| 22 | 1.5 | 4 | C1 | 1 | 0 | 1 | 1 | 0 | 1 | 1 | 1 |
| 21 | 1.1 | 2 | C1 | 1 | 1 | 0 | 1 | 0 | 1 | 1 | 1 |
| 20 | .76 | 14 | C2 | 0 | 0 | 0 | 1 | 1 | 0 | 1 | 1 |
| 19 | .53 | 10 | C2 | 0 | 1 | 0 | 1 | 1 | 0 | 1 | 1 |
| 18 | .38 | 7 | C2 | 1 | 0 | 0 | 0 | 1 | 0 | 1 | 1 |
| 17 | .26 | 5 | C2 | 1 | 0 | 1 | 0 | 1 | 0 | 1 | 1 |
| 16 | .19 | 4 | C2 | 1 | 0 | 1 | 1 | 1 | 0 | 1 | 1 |
| 15 | .13 | 3 | C2 | 0 | 1 | 0 | 0 | 1 | 0 | 1 | 1 |
| 14 | .095 | 13 | C3 | 0 | 0 | 1 | 0 | 1 | 1 | 0 | 1 |
| 13 | .067 | 9 | C3 | 0 | 1 | 1 | 0 | 1 | 1 | 0 | 1 |

TABLE I-continued

| WAVEFORM NUMBER | WAVEFORM RATE OF CHANGE (VOLTS/μS) | DAC OUTPUT (VOLTS) | CAPACITOR | P1 | P2 | P3 | P4 | P5 | P6 | P7 | P8 |
|---|---|---|---|---|---|---|---|---|---|---|---|
| 12 | .048 | 7 | C3 | 1 | 0 | 0 | 0 | 1 | 1 | 0 | 1 |
| 11 | .034 | 5 | C3 | 1 | 0 | 1 | 0 | 1 | 1 | 0 | 1 |
| 10 | .024 | 9 | C4 | 0 | 1 | 1 | 0 | 1 | 1 | 1 | 0 |
| 9 | .017 | 7 | C4 | 1 | 0 | 0 | 0 | 1 | 1 | 1 | 0 |
| 8 | .012 | 5 | C4 | 1 | 0 | 1 | 0 | 1 | 1 | 1 | 0 |
| 7 | .0085 | 2 | C3 | 1 | 1 | 0 | 1 | 1 | 1 | 0 | 1 |
| 6 | .0060 | 4 | C4 | 1 | 0 | 1 | 1 | 1 | 1 | 1 | 0 |
| 5 | .0042 | 3 | C4 | 1 | 1 | 0 | 0 | 1 | 1 | 1 | 0 |
| 4 | .0030 | 1 | C3 | 1 | 1 | 1 | 0 | 1 | 1 | 0 | 1 |
| 3 | .0021 | 2 | C4 | 1 | 1 | 0 | 1 | 1 | 1 | 1 | 0 |
| 2 | .0015 | 1 | C4 | 1 | 1 | 1 | 0 | 1 | 1 | 1 | 0 |
| 1 | .0010 | 0 | C4 | 1 | 1 | 1 | 1 | 1 | 1 | 1 | 0 |

Table I is arranged to show the particular rate of voltage change or linear waveform that is generated by waveform generator 26 when a particular data word appears at PROM 50 outputs P1-P8. As used here, "1" designates a voltage level that opens a particular analog switch while "0" designates a voltage level that causes an analog switch to close. For example, an output of "10111011" appearing on outputs P1-P8, respectively, will cause DAC 54 to provide a d.c. voltage level of 4 volts, capacitor C2 to be selected by analog switch 58 closing, and waveform generator 26 to generate a linear waveform having a rate of change of 0.19 volts per micro-second.

Each of the PROM output P1-P8 combinations shown in Table I is stored at various 8-bit storage locations of PROM 50. Thus, for every conceivable combination appearing on output lines S1-S8 of shift register 46, which is used to address each PROM location, one of the PROM output P1-P8 combinations of Table I will appear to cause waveform generator 26 to generate a waveform of a specific (linear) voltage variation associated with the PROM output combination (designated in Table I).

The heart of transforming the contents of shift register 46 into a linear waveform of predetermined rate of change lies, therefore, in the contents of PROM 50 and how those contents are determined. While there exists a number of methods that can be used to "program" the PROM, the following method has thus far been found to be easiest:

1. A string of logic ONES or logic ZEROS appearing at outputs S1-S8 of shift register 46 indicates that the respective rates of change of the input analog signal applied to terminal 14 and the reference signal have not matched for some time. Accordingly, the selected rate of change of the waveform generated by waveform generator 26 should be a maximum during the period allotted (i.e., the period between any two successive samples). Thus, the storage locations of PROM 50 that would be addressed by eight logic ONES or eight logic ZEROS (appearing on outputs S1-S8 of shift register 46) would be "00000111" which, as Table I shows, selects waveform 1, having the maximum rate of change of 4.2 volts per micro-second.

2. A string of alternating ZEROS and ONES appearing at outputs S1-S8 of the shift register indicates that the reference signal is tracking the analog input signal, and that the analog signal is approaching a constant level. Accordingly, the rate of change of the reference signal should be a minimum. Thus, the storage location of PROM 50 for addresses of alternating ONES and ZEROS appearing as shift register outputs S1-S8 will contain data word "11111110". Thereby, waveform number 25 (Table I) will be generated, having a rate of change of 0.0010 volts per micro-second.

3. For all other combinations of logic ONES and ZEROS appearing on outputs S1-S8 of shift register 46, the following criteria is used to select the bit configuration that will appear at PROM outputs P1-P8:

(a) At the outset, waveform number 12 is selected as a starting point and assumed to be the waveform generated just prior to the next selection. An initial series of logic ONES or ZEROS appearing at shift register outputs S8, S7 and through to S1 moves the waveform selection from waveform number 12 upward in steps corresponding to (24-12)/7 to the nearest integer. Thus, if output S8 is a logic ONE (or logic ZERO), waveform number 12 is selected as a starting point and, for each logic ONE (or logic ZERO), the waveform selection progresses upward to waveform numbers 14, 15, 17 and so on, in steps of 1.7 (to the nearest integer) until the last logic ONE (logic ZERO) in the series is reached.

(b) If, after obtaining the RC combination of step (a), the next sequentially appearing outputs of shift register 46 are a series of alternating logic ONES or logic ZEROS, RC selection digresses from the waveform selected by step (a) in steps of ("A"-1)/7, where "A" is the waveform number obtained in step (a).

(c) Finally, if a series of logic ONES or logic ZEROS remains after the waveform selection of step (b), above, the waveform numbers are stepped through upwards from the waveform number obtained in step (b) in steps determined by (24-"B")/7 to the nearest integer, where "B" is that waveform number obtained by step (b).

These steps are used to establish the contents of each storage location of PROM 50. A more complete understanding of how the steps outlined above are used to PROM 50 will be obtained from the following examples.

SELECTION EXAMPLE NO. 1

This example determines what should be programmed at the storage location addressed by a logic "00101000" appearing on outputs S1 through S8, respectively. As step 3(a), above, points out, selection begins by noting that an initial string of logic ZEROS appears on outputs S6-S8 of the shift register. According to step 3(a), therefore, selection begins with waveform number 12 and progresses upward therefrom in steps of (24-12)/7 or 1.7 to the nearest integer. There are two steps (from the logic ZERO appearing on output S8 to those appearing on outputs S7 and S6). Accordingly, selection progresses upward 2 times (1.7) or, to the nearest integer, 3 waveform numbers to number 15.

Following the initial string of logic ZEROS appearing on outputs S6-S8 of shift register 46 is a series of alternating logic ONES and ZEROS appearing on outputs S3-S5. Thus, according to step 3(b), waveform selection proceeds by digressing from the combination selected in step 3(a) in steps of [("A"-1)/7 to the nearest integer] from the waveform number combination determined by step 3(a). Since there are three transitions in the alternating series, selection according to step 3(b) requires 3 times (15-1)/7 or 6 waveform numbers down from waveform number 15 to number 9.

The final string of logic ZEROS appearing on outputs S1 and S2 of shift register 46 dictate, via step 3(c), progressing sequentially upward from waveform number 9 four waveform numbers to waveform number 13. That is, 2 times (24-9)/7 or 4 (3.7 to the nearest integer) are the number of steps upward to be taken from waveform number 9 (obtained by preceding step 3(b)). Accordingly, the waveform to be generated is designated as waveform number 13. Thus, the location addressed by an "0010100" appearing on shift register outputs S1-S8 should contain a data word that would appear at PROM outputs P1-P8 as "01100010", respectively.

RAMP SELECTION EXAMPLE NO. 2

This example assumes that the logic levels appearing on outputs S1-S8 of shift register 46 are logic "00100001". As in Example No. 1, it must be determined what should be contained in the storage location addressed by this particular configuration by resorting to the criteria of steps 3(a)-3(b), above. Thus, beginning with step 3(a), it is noted that there is no initial series of logic ONES or ZEROS. Accordingly, only the starting waveform number—12—is selected.

Similarly, when the outputs S4-S7 are viewed from output S8 of the shift register, there is no series alternating logic ONE-ZERO pattern. Accordingly, the selection process proceeds through step 3(b) to step 3(c).

When viewed from output S8, and according to step 3(c), the four logic ZEROS that appear on outputs S4-S7 present four transitions that require waveform selection to sequence upward from that waveform number previously selected (i.e., number 12) by 4 times (24−12)/7 or 7 (to the nearest integer) steps. Progressing upward 7 waveform numbers from 12 leads to number 19.

Viewing now from output S4 (towards S1) an alternating series of logic ONES and ZEROS having two transitions are seen. Accordingly, step 3(b) requires the selection process to digress from that number previously obtained (number 19) in steps of 2 times (21-1)/7 or 6 (to the nearest integer). Digressing down from waveform number 19 by 6 steps obtains waveform number 13 and the selection process proceeds back to step 3(c).

Selection has now been determined for outputs S3-S8 of the shift register. There is one final transition (from output S2 to output S1) viewed as a series of zeros. According to step 3(c), therefore, selection proceeds upward from waveform number 13 by 1 times (24-15)/7 (to the nearest integer) or 1 step. Thus, the waveform to be generated when the shift register outputs S1-S8 of "00100001" are applied to PROM 50 will be the waveform having a rate of change of 0.095 volts per microsecond—waveform number 14. The storage location addressed by this combination would cause, therefore, a "00101101" to appear on outputs P1-P8, respectively, of PROM 50.

It should be noted that in addition to selection of one of the 25 available waveforms specified in Table I, polarity control circuit 48 doubles this number to effectively expand the dynamic range of the input signal into 48 individual rates of change increments to be estimated by the reference signal.

Returning now to FIG. 2, the operation of the invention can now be described in more detail. An analog input signal to be digitized is applied to input 14 of comparator A and compared with a reference signal applied to input 16. The rates of change of signals are compared by comparator A. The result of the comparison appears on output line 17 and, at any moment in time, is one of two available digital states: A logic ONE or a logic ZERO. One state, a logic ONE for example, indicates that the rate of change of the signal applied to input 16 is greater than the rate of change of the signal applied to input 14. Conversely, a logic ZERO indicates the rate of change of the signal applied to input 14 is greater than that of the signal applied to input 16.

Output line 17 is periodically sampled by flip-flop 42 i response to clock pulses received via clock terminal 44. At the same time, previous content of flip-flop 42 is stored in shift register 46 while the remaining contents of the shift register are shifted one bit position (e.g., S2 to S3, S3 to S4, etc.) upon the receipt of each clock pulse via clock terminal 44.

The content of shift register 46 is applied via shift register outputs S1-S8 to PROM 50. At the same time, shift register output S1 is applied to analog switch 49 of polarity control circuit 24. PROM 50 translates content of shift register 46 to an output data word that appears on PROM outputs P1-P8 to select an appropriate d.c. voltage level (generated by DAC 52) and capacitor (selected from capacitors C1-C4) to cause waveform generator 26 to generate a waveform of a predetermined rate of change. DAC 52 is capable of generating at least 16 individual d.c. voltage levels. Accordingly, all possible digital states are capable of appearing at PROM outputs P1-P4 to select one of the 16 voltage levels generated by DAC 52. The voltage so generated is actually a current and, accordingly, current-to-voltage amplifier 54 transforms the current to a voltage which is applied to polarity control circuit 24. The polarity amplifier 48 of polarity control circuit 24 has a gain of one and, therefore, will either pass the voltage level applied thereto directly to the non-inverting input of waveform generator 26 (when analog switch 49 is in the open position as shown) or will invert the voltage when a logic ZERO appears on shift register output S1 to close analog switch 49.

The selection of the appropriate capacitor from capacitors C1-C4 is, in this embodiment, mutually exclusive. That is, only a single logic ZERO will appear at PROM outputs P5-P8 at any one moment in time, the remainder of the outputs being logic ONE. Thus, for example, a logic ZERO appearing on PROM output P6 will cause analog switch 58 to close, placing capacitor C2 in the feedback path of waveform generator 26. At the same time, PROM output P6 is applied to inverter I3 which, in turn, causes a logic ONE to be applied to analog switch 66, opening the switch. PROM outputs P5, P7 and P8 have a logic ONE appearing thereon to cause analog switches 56, 60 and 62 to open and (via inverters I1, I2 and I4) analog switches 64, 68 and 70 to close. Capacitors C1, C3 and C4 are removed from the feedback path of waveform generator 26 and, during their time of removal, are neutralized (e.g., discharged) by closure of analog switches 64, 68 and 70.

With a specific d.c. voltage level selected by PROM outputs P1-P4 of PROM 50 and polarity circuit 24 (operated by shift register output S1) and the selection of one of capacitors C1-C4, waveform generator 26 is caused to generate a linear waveform until the next clock pulse appears on clock terminal 44. The next clock pulse will again cause flip-flop 42 to sample output line 17 of comparator A and store the prior content of flip-flop 42 in shift register 46, shifting the shift register contents one position. Assuming the change in shift register 46 content, a new d.c. voltage level and/or capacitor selection is made to cause waveform generator 26 to generate a linear waveform of a different rate of change from that previous. As described above, sample-and-hold circuits 74 and 76 operate to alternately track the voltage provided by waveform generator 26 and to provide a reference level from which each new linear waveform generated proceeds from. In this manner, a reference signal is formed from a piecewise accumulation of each linear waveform generated by waveform generator 26.

The waveforms so generated are applied, via buffer 72, to input terminal 16 of comparator A for comparison with the analog input signal being digitized, as explained above.

Operation of the circuitry of FIG. 2 is identical when the invention is being used in its decoding mode except that comparator A is excluded from circuit operation. When used as a decoder 12 (FIG. 1) the digitized signal from which the analog approximation is to be extracted is applied to flip-flop 42 via line 17. An appropriate clock pulse is applied to clock terminal 44 and the circuit operates as described above. The output, a linear piecewise approximation of the analog signal that was digitized, appears at output line 87 after filtering via filter 83.

It is presently contemplated that a fourth-order Bessel filter will be used as filter 83 because of superior group delay response and transient response. Such filters have a very slow initial roll-off which prevents its use by other more conventional analog-to-digital conversion techniques. However, due to the particular signal applied to filter 83, that is the signal being an accumulation of linear ramps instead of step digital outputs, a fourth-order Bessel filter can be used. Conventional digital-to-analog conversions require the use of expensive and complex Butterworth, Chebishev or Anti-Aliasing type filters which have a higher initial roll-off but a poorer transient response and significantly greater group delay.

While the above provides a full and complete disclosure of the preferred embodiment of the invention, various modifications, alternate constructions and equivalents may be employed without departing from the true spirit and scope of the invention. For example, comparator A, rather than comparing rates of change, can compare amplitudes of the signals applied thereto. Further, DAC 52 can be replaced with a simple resistor matrix operated in similar fashion as capacitors C1-C4 so that a particular resistor-capacitor combination would be selected to control the rate of change of the waveform generated by waveform generator 26.

Therefore, the above description and illustrations should not be construed as limiting the scope of the invention, which is defined by the appended claims.

What is claimed is:

1. A system for obtaining a digital representation of an analog signal, comprising:
   means responsive to the analog signal and a reference signal for developing a binary signal indicative of a predetermined characteristic of the analog signal relative to the corresponding characteristic of the reference signal;
   means for periodically sampling the binary signal and for producing the digital representation therefrom, the sampling means including means for storing a plurality of successive samples of the binary signal; and
   means coupled to the storing means and responsive to the stored samples for selectively generating one of a plurality of linear waveforms and for successively combining the linear waveforms generated to form the reference signal;
   the generating means including means for providing a predetermined voltage, means having a selectively variable capacitance for integrating the predetermined voltage to develop therefrom from the linear waveforms, selection means responsive to said stored samples for varying the capacitance of said integrating means to determine the slope of each of the linear waveforms generated, and at least a first and a second sample and hold means coupled to one another and to said integrating means in parallel circuit configuration, each having an input for receiving the linear waveform developed by the integrating means and an output coupled to the integrating means, for alternately sampling the linear waveforms developed by the integrating means and holding instantaneous values of said linear waveform, whereby the successive linear waveform segments are thereby accumulated to form the reference signal.

2. The system of claim 1, wherein said voltage providing means includes means for selectively developing a plurality of D.C. voltage levels, and wherein said selection means includes means for selecting a one of said D.C. voltage levels in response to said stored samples.

3. The system of claim 1, wherein the selection means includes memory means responsive to the stored samples of the binary signal for providing a predetermined data word, at least a portion of said data word being applied to the integrating means to vary the capacitance.

4. The system of claim 1, wherein the characteristic of the analog signal is the amplitude of the analog signal.

5. The system of claim 1, wherein the characteristic of the analog signal is the rate of change with respect to time of the analog signal.

6. The system of claim 1, including means responsive to the stored samples for determining the polarity of the predetermined voltage.

7. Apparatus for converting an analog signal into a digital signal and for subsequently extracting an approximation signal representative of said analog signal from said digital signal, comprising:
   encoding means for developing said digital signal, the encoding means including:

(a) comparator means responsive to the analog signal and a feedback signal for producing a binary signal indicative of a characteristic of said analog voltage relative to a corresponding characteristic of the feedback signal;

(b) means for periodically sampling the binary signal to produce said digital signal;

(c) first storage means for storing successive samples of said binary signal;

(d) first generating means for providing said feedback signal in the form of an accumulation of successive linear waveform segments, the first generating means including means for selectively providing a first plurality of predetermined D.C. voltages, means having a first selectively variable capacitance for receiving and integrating the first predetermined D.C. voltages to develop therefrom the linear waveform segments, first selection means coupling said first storage means to said first voltage means and to said first variable capacitance and responsive to said stored samples for selecting a one of the first plurality of D.C. voltages and for varying the first variable capacitance of said integrating means and first accumulating means for receiving and combining the linear waveform segments to form therefrom said reference waveform, the first accumulating means including at least a pair of sample and hold means coupled to one another in parallel circuit configuration, each having an input for receiving the linear waveform segments developed by the integrating means and an output coupled to the integrating means, for alternately sampling and holding the instantaneous values of the linear waveform segment;

decoding means for receiving said digital signal and for obtaining therefrom said approximation, said decoding means including:

(e) second storage means for storing successive bits of said digital signal equal in number to the samples stored by the first storage means;

(f) second generating means responsive to said storing means for developing the approximation signal from an accumulation of successive further linear waveform segments, the second generating means including means for selectively providing a plurality of second D.C. voltages, means having a second selectively variable capacitance for receiving and integrating the second predetermined D.C. voltages to develop therefrom the further lineal waveform segments, second selection means copyling said second storage means to said second voltage providing means and to said second variable capacitance and means responsive to said stored bits for selecting a one of the second D.C. voltages and for varying the second variable capacitance of said integrating means, and second accumulation means for receiving and combining the further linear waveforms to form the approximation signal; and data linking means for transferring said digital signal from said encoding means to said decoding means.

* * * * *